US012080632B2

United States Patent
Kulkarni et al.

(10) Patent No.: US 12,080,632 B2
(45) Date of Patent: Sep. 3, 2024

(54) GLASS CORE PACKAGE SUBSTRATES

(71) Applicant: Advanced Micro Devices, Inc., Santa Clara, CA (US)

(72) Inventors: Deepak Vasant Kulkarni, Santa Clara, CA (US); Rahul Agarwal, Santa Clara, CA (US); Rajasekaran Swaminathan, Austin, TX (US); Chintan Buch, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 53 days.

(21) Appl. No.: 17/489,182

(22) Filed: Sep. 29, 2021

(65) Prior Publication Data

US 2023/0102183 A1   Mar. 30, 2023

(51) Int. Cl.
*H01L 23/495* (2006.01)
*H01L 23/14* (2006.01)
*H10B 12/00* (2023.01)

(52) U.S. Cl.
CPC ........ *H01L 23/4951* (2013.01); *H01L 23/145* (2013.01); *H10B 12/50* (2023.02)

(58) Field of Classification Search
CPC .... H01L 23/4951; H01L 23/145; H10B 12/50
See application file for complete search history.

(56) References Cited

U.S. PATENT DOCUMENTS

2004/0061147 A1* 4/2004 Fujita ..................... H01L 25/18
714/E11.16

2009/0296360 A1* 12/2009 Doblar ................. H05K 7/1061
361/767

(Continued)

FOREIGN PATENT DOCUMENTS

EP          3007221 A1    4/2016
EP          3772098 A1    2/2021

OTHER PUBLICATIONS

Pfeiffenberger et al., U.S. Appl. No. 18/169,788, entitled "Substrate Defined Coupled Inductors With Embedded Solid Ferrite Core", filed Feb. 15, 2023, 39 pages.

(Continued)

*Primary Examiner* — Peniel M Gumedzoe
(74) *Attorney, Agent, or Firm* — Kowert, Hood, Munyon, Rankin & Goetzel, P.C.; Rory D. Rankin

(57) ABSTRACT

Apparatuses, systems and methods for efficiently generating a package substrate. A semiconductor fabrication process (or process) fabricates each of a first glass package substrate and a second glass package substrate with a redistribution layer on a single side of a respective glass wafer. The process flips the second glass package substrate upside down and connects the glass wafers of the first and second glass package substrates together using a wafer bonding technique. In some implementations, the process uses copper-based wafer bonding. The resulting bonding between the two glass wafers contains no air gap, no underfill, and no solder bumps. Afterward, the side of the first glass package substrate opposite the glass wafer is connected to at least one integrated circuit. Additionally, the side of the second glass package substrate opposite the glass wafer is connected to a component on the motherboard through pads on the motherboard.

13 Claims, 5 Drawing Sheets

(56) References Cited

U.S. PATENT DOCUMENTS

| | | |
|---|---|---|
| 2011/0304999 A1 | 12/2011 | Yu et al. |
| 2016/0035711 A1* | 2/2016 | Hu .................... H01L 25/18 |
| | | 257/686 |
| 2016/0079149 A1* | 3/2016 | Yoshida ............ H05K 3/241 |
| | | 174/257 |
| 2020/0152562 A1 | 5/2020 | Iwai et al. |

OTHER PUBLICATIONS

Invitation to Pay Additional Fees, Communication Relating to the Results of the Partial International Search and Provisional Opinion Accompanying the Partial Search Result in International Application No. PCT/US2022/076540, mailed Dec. 14, 2022, 8 pages.
International Search Report and Written Opinion in International Application No. PCT/US2022/076540, mailed Jan. 19, 2023, 18 pages.

* cited by examiner

GLASS CORE PACKAGE SUBSTRATES

BACKGROUND

Description of the Relevant Art

There is a growing demand for semiconductor packages that provide communication between one or more integrated circuits in a chip package and external components on a motherboard located externally from the chip package. Electronic products associated with mobile computing, wearable electronics, and the Internet of Things (IoT) drive the demand for small packages that utilize vertical signal interconnections. Examples of the chip packages used in these products include ball grid arrays (BGAs), chip scale packages (CSPs), and System in Packages (SiPs).

One configuration for the SiP, as an example, is to stack one or more integrated circuits next to and/or on top of a processing unit. Progress has been made in three-dimensional integrated circuits (3D ICs) that include two or more layers of active electronic components integrated both vertically and horizontally into a single circuit. Components within these layers communicate using on-chip signaling, whether vertically or horizontally. Through silicon vias (TSVs) and groups of TSVs forming through silicon buses are used as interconnects between a base processor die, one or more additional integrated circuits, and signals on a printed circuit board (pcb) such as a motherboard or a card.

The demand for SiPs and more signal interconnects between the integrated circuits and the pcb also increases the demand for package substrates and interposers. The package substrate is a part of the chip package that provides mechanical base support as well as provides an electrical interface for the signal interconnects. An interpose is an intermediate layer between the one or more integrated circuits and either flip chip bumps or other interconnects and the package substrate. When used, the interposer provides the electrical interface for the signal interconnects. Depending on the implementation, the terms package substrate and interposer are used interchangeably.

Typically, the package substrate is composed of epoxy/glass fiber cores and organic compounds such as carbon and hydrogen. The metal layers providing the signal traces have limited length and spacing due to the surface roughness of the organic package substrate that puts constraints on creating patterns for high volume manufacturing (HVM). A greater number of metal layers on thin organic package substrates also require rigidity that organic package substrates lack. Additionally, mismatches in the coefficient of thermal expansion (CTE) between silicon and bonding materials creates mechanical stress that results in fractures or cracks in the organic package substrate. Further, the composite nature of the organic package substrate restricts the diameter and pitch scaling of the plated through hole (PTH) pads.

In view of the above, efficient methods and systems for generating a package substrate are desired.

Figure 1:
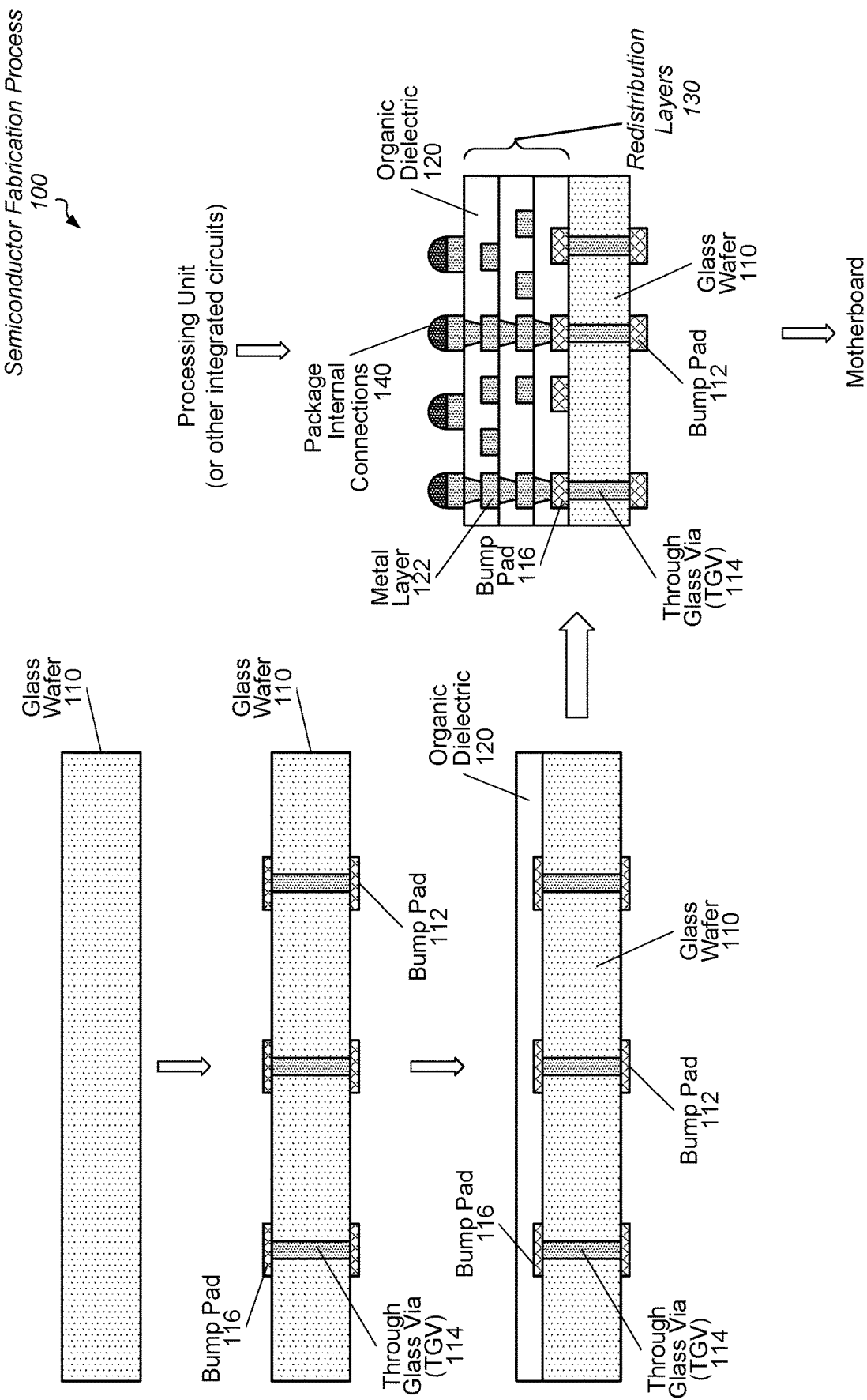
FIG. 1 is a generalized diagram of a semiconductor fabrication process that generates a glass package substrate from a glass wafer with asymmetric metal layers.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses, systems and methods for efficiently generating a package substrate are contemplated. A semiconductor fabrication process (or fabrication process) fabricates each of a first glass package substrate and a second glass package substrate with a redistribution layer on a single side of a respective glass wafer. The glass wafers are made of borosilicate, quartz material, fused silica, or other. The fabrication process flips the second glass package substrate upside down and connects the glass wafers of the first and second glass package substrates together using a wafer bonding technique. In some implementations, the fabrication process uses copper-based wafer bonding. The resulting bonding between the two glass wafers contains no air gap, no underfill, and no solder bumps. Afterward, the side of the first glass package substrate opposite the glass wafer is connected to at least one integrated circuit. Additionally, the side of the second glass package substrate opposite the glass wafer is connected to a component on the motherboard through pads on the motherboard.

Turning to FIG. 1, a generalized block diagram of a semiconductor fabrication process 100 is shown that generates a glass package substrate from a glass wafer with asymmetric metal layers. As shown, multiple semiconductor fabrication process steps are performed with the glass wafer 110. As used herein, a "glass wafer" is also referred to as a "glass core." The glass wafer 110 is used to build a glass package substrate that provides both mechanical base support for a semiconductor chip package as well as provides an electrical interface for the signal interconnects. The glass wafer 110 is made of one of a variety of materials such as borosilicate, quartz material, and fused silica.

The glass wafer 110 has through glass vias 114 created through the entire thickness of the glass wafer 110. In some implementations, holes are manufactured into the glass wafer 110 such as using masked isotropic wet etching of glass and laser drilling. In other implementations, glass is flown around fabricated metal rods positioned in a particular pattern. Additionally, one of a variety of magnetic self-assembly methods is used to form the through glass vias 114. The bump pads 116 are directly placed on top of the through glass vias 114 by using a solder paste jetting process or other. The bump pads 112, the through glass vias 114, and the bump pads 116 are used for routing input/output (I/O) signals and power signals between one or more integrated circuits later placed on top of the glass package substrate and one or more components on a motherboard (or printed circuit board) below the glass package substrate.

In various implementations, the vertical through glass vias 114 are grouped together to form through glass buses (TGBs). The through glass buses are an alternative interconnect to wire-bond and flip chips. The size and density of the vertical through glass vias 114 in the glass wafer 110 varies based on the underlying technology used to fabricate the glass package substrate. The glass wafer 110 replaces an organic package substrate. Organic package substrates are made of organic small molecules or polymers that contain carbon atoms and hydrogen atoms, and sometimes compounds such as pentacene, anthracene, and rubrene. Organic package substrates are electrical insulators. However, the package substrates conduct current when doped with impurities.

The glass wafer 110 has properties that make it a better candidate for generating a package substrate than using an organic package substrate. For example, the glass wafer 110 has an adjustable coefficient of thermal expansion (CTE) that allows the glass wafer 110 to match the CTE of silicon and other bonding materials. The glass wafer 110 has a relatively low dielectric constant, a relatively high rigidity and strength, a relatively high resistivity, and thus, a low electrical loss. The glass wafer 110 also has an extremely smooth surface that does not require expensive polishing processes. Further, the glass wafer 110 is capable of being processed by relatively high temperature steps.

Once the through glass vias 114 and bump pads 112 and 116 are formed, an organic dielectric 120 is deposited on top of the bump pads 116 and the glass wafer 110. The organic dielectric 120 is used in place of silicon dioxide, which is an inorganic dielectric. The organic dielectric 120 has a relatively small dielectric constant compared to silicon dioxide. When compared with silicon dioxide, the organic dielectric 120 also has a better capability to reduce parasitic capacitance, enable faster switching of signals, and provide lower heat dissipation. A variety of semiconductor fabrication methods are capable of generating the organic dielectric 120 such as doping silicon dioxide with organic molecules such as carbon and fluorine, or selecting silicon-based organic materials that include hydrogen or other organic molecules.

Afterward, the organic dielectric 120 is etched based on the patterns of the signal routes, and a metal layer 122, such as copper or other, is deposited and polished. The signal routes formed by the metal layers 122 provide the redistribution layers 130 of the glass package substrate. The redistribution layers 130 are extra layers of signal interconnects that route signals out to different locations, which eases chip-to-chip bonding. Therefore, having a set of input/output (I/O) pads that are wire bonded to pins of the package is unnecessary. In some implementations, the steps for forming bump pads 116, and the organic dielectric 120 with patterns for signal routes filled by the metal layers 122 are repeated. In other words, the redistribution layers 130 includes multiple layers, rather than a single layer of signal interconnects. The rigidity of the glass wafer 110 supports these multiple layers of signal interconnects.

After completion of the redistribution layers 130, the package internal connections 140 (or connections 140) are formed. In various implementations, the connections 140 are micro bumps. One or more integrated circuits, such as a processing unit, are placed on top of the connections 140. Additionally, the built glass package substrate is placed on a motherboard (or printed circuit board) such that the bump pads 112 make connections with pads on the motherboard. As described earlier, the glass wafer 110 being used to create the glass package substrate provides multiple benefits over using an organic package substrate. The widths and spacings of the signal routes are finer, since the through glass vias are able to be placed relatively close to one another. A reduced pitch scaling of the plated through hole (PTH) pads eliminates the use of back side metal layers. Both signal integrity and yield also improve. The glass wafer 110 also has a significantly higher Young's modulus than epoxy molding compound or other polymers.

Figure 2:
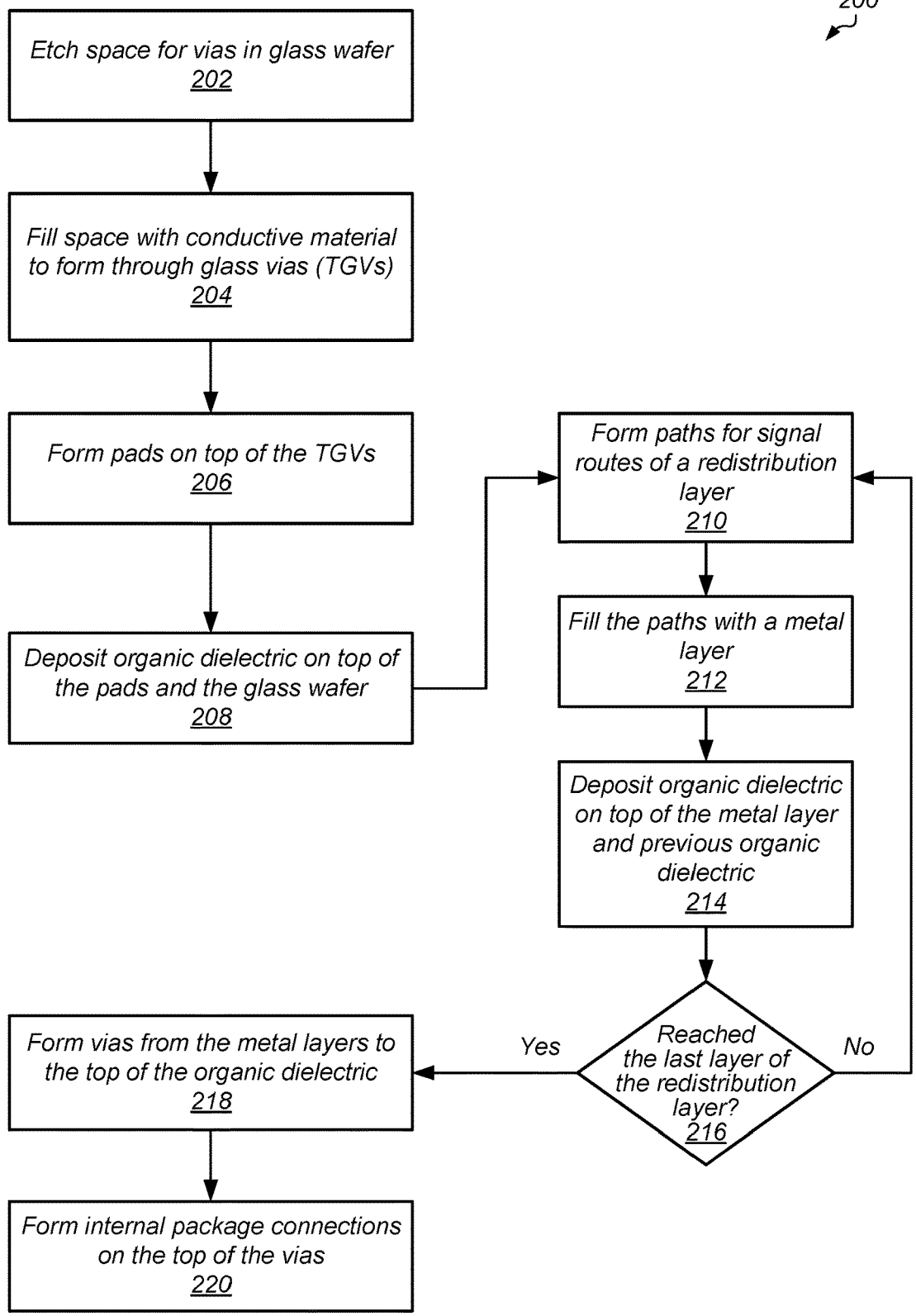
FIG. 2 is a generalized diagram of one implementation of a method for generating a glass package substrate from a glass wafer with asymmetric metal layers.

Referring now to FIG. 2, one implementation of a method 200 is shown for generating a glass package substrate from a glass wafer with asymmetric metal layers. For purposes of discussion, the steps in this implementation (as well as in FIG. 4) are shown in sequential order. However, in other implementations some steps occur in a different order than shown, some steps are performed concurrently, some steps are combined with other steps, and some steps are absent.

A glass wafer made of borosilicate, quartz material, fused silica, or other is selected for fabricating a glass package substrate. The fabrication process etches spaces for vias in the glass wafer (block 202). In other implementations, glass is flown around fabricated metal rods positioned in a particular pattern. The fabrication process fills the space with conductive material to form through glass vias (TGVs) (block 204). For example, one of a variety of magnetic self-assembly methods is used to form the through glass vias. The fabrication process forms pads on top of the TGVs (block 206).

The fabrication process deposits organic dielectric on top of the pads and the glass wafer (block 208). Following, the fabrication process etches paths in the organic dielectric for signal routes of a redistribution layer (block 210). The fabrication process fills the etched paths with a metal layer (block 212). Afterward, the fabrication process deposits organic dielectric on top of the metal layer (block 214). If the last layer of the redistribution layer has not been reached ("no" branch of the conditional block 216), then control flow of method 200 returns to block 210 where the fabrication process etches paths in the organic dielectric for signal routes of a redistribution layer. However, if the last layer of the redistribution layer has been reached ("yes" branch of the conditional block 216), then the fabrication process forms vias from the metal layers to the top of the organic dielectric (block 218). Following, the fabrication process forms internal package connections on the top of the vias (block 220). In an implementation, these connections are micro bumps. The glass package substrate is ready to be placed between at least one integrated circuit and a motherboard.

Figure 3:
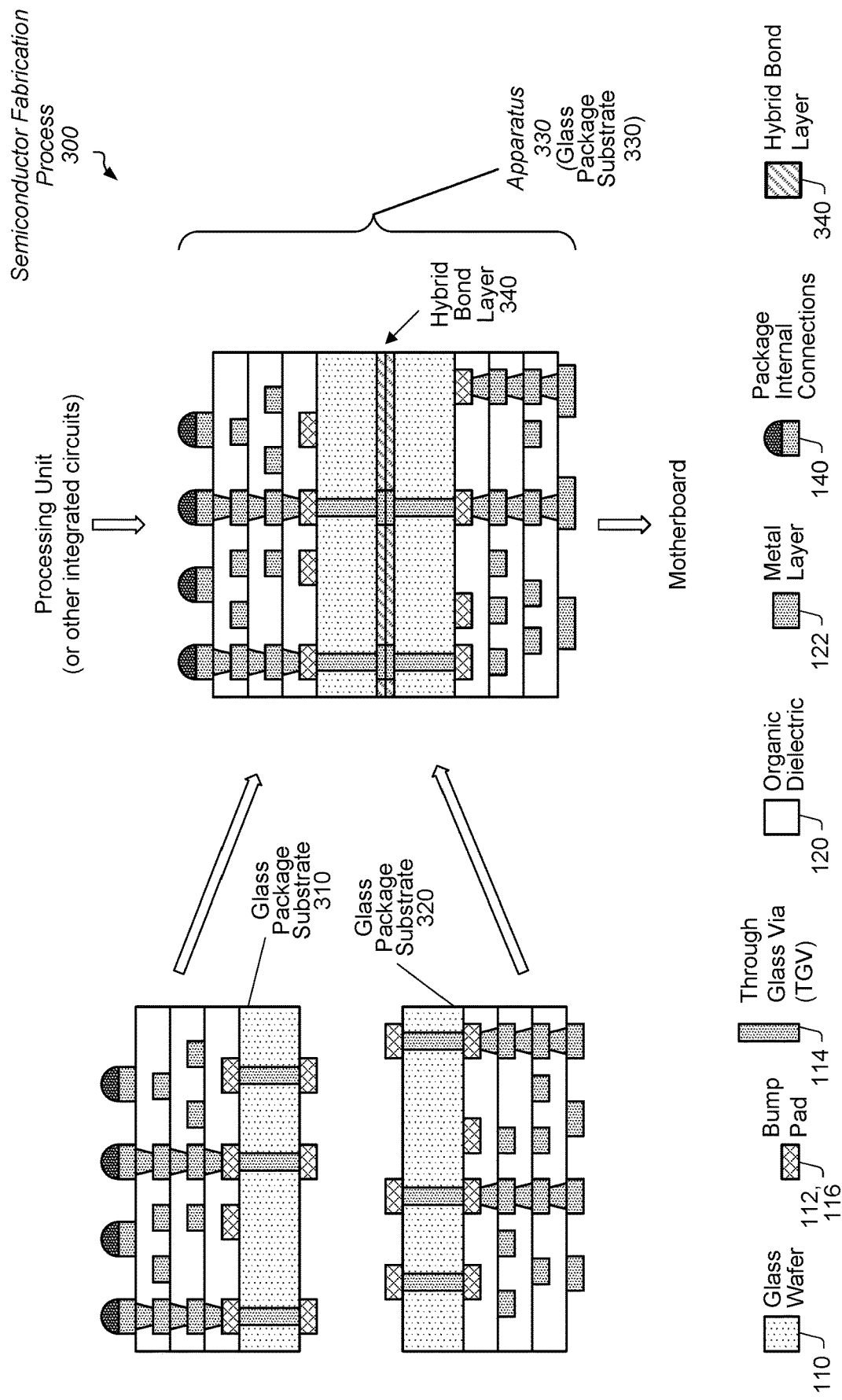
FIG. 3 is a generalized diagram of semiconductor fabrication process that generates stacked glass package substrates from glass wafers with asymmetric metal layers.

Turning to FIG. 3, a generalized block diagram of a semiconductor fabrication process 300 is shown that generates stacked glass package substrates from glass wafers with asymmetric metal layers. Layout elements and materials described earlier are numbered identically. Using the fabrication process steps described earlier, the glass package substrate 310 is created. Similarly, the glass package substrate 320 is created, but with no connections 140 such as micro bumps. Each of the glass package substrates 310 and 320 have redistribution layers on a single side of the respective glass wafers. To form apparatus (glass package substrate) 330, the glass package substrate 320 is flipped upside down and bonded with the glass package substrate 310 using a wafer bonding technique. For example, copper-based wafer bonding is used. As shown, a hybrid bond layer 340 is placed between the glass package substrates 310 and 320. In various implementations, the hybrid bond layer 340 includes copper. The resulting bonding between the two glass wafers contains no air gap, no underfill, and no solder bumps.

Conventional fabrication processes that use organic package substrates insert liquid underfill between the package substrate or interpose and the motherboard. The process also inserts underfill between an integrated circuit and the redistribution layers of the organic package substrate. There is a thermal expansion mismatch between silicon of the integrated circuit, solder balls or micro bumps, and the organic package substrate. The underfill is a liquid resin with a coefficient of thermal expansion (CTE) similar to the CTE of the solder bumps or micro bumps. However, the use of the glass package substrates 310 and 320 makes the use of underfill unnecessary. Afterward, the side of the glass package substrate 310 opposite the glass wafer is connected to at least one integrated circuit. Additionally, the side of the glass package substrate 320 opposite the glass wafer is connected to the motherboard.

Figure 4:
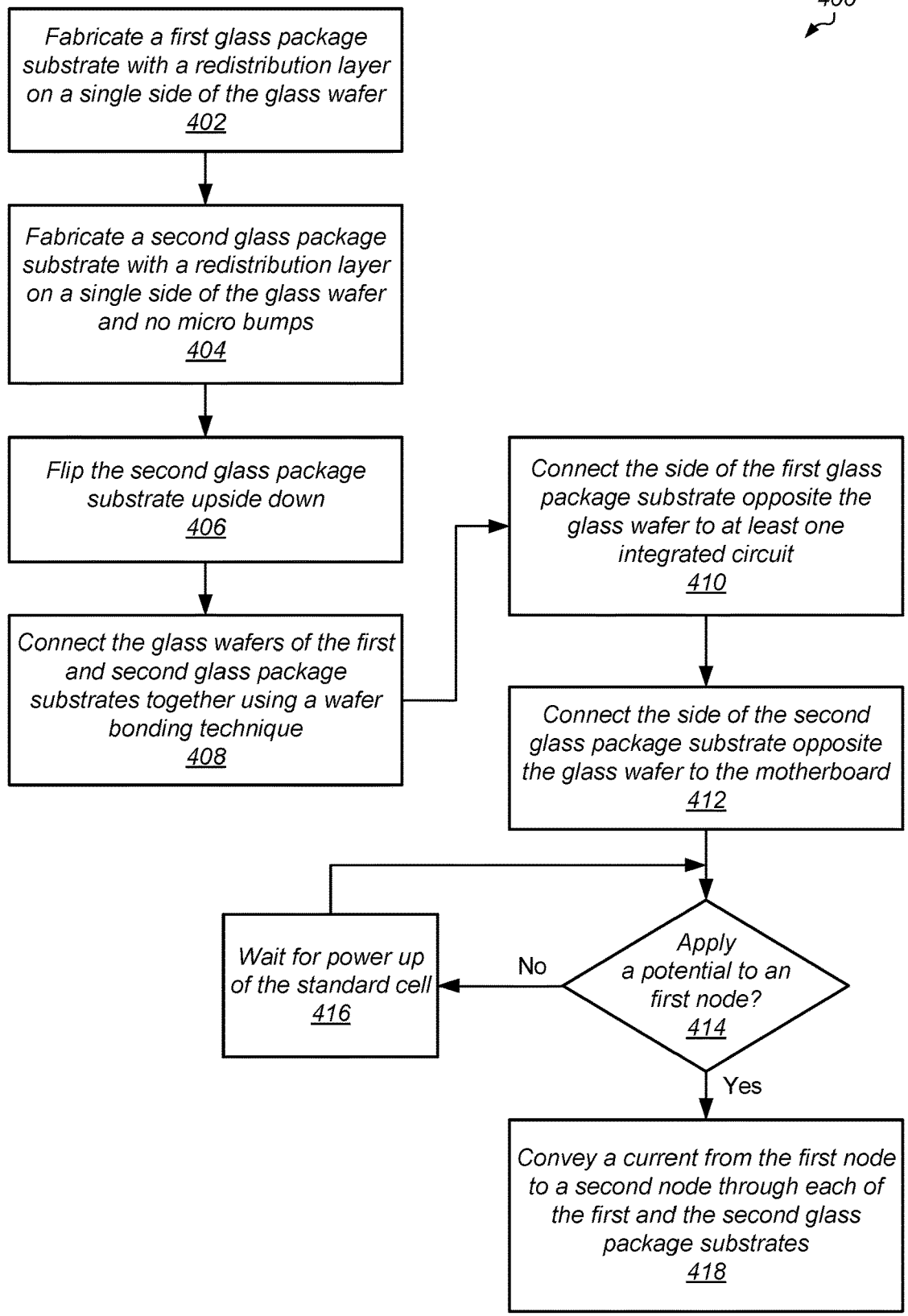
FIG. 4 is a generalized diagram of one implementation of a method for generating stacked glass package substrates from glass wafers with asymmetric metal layers.

Referring now to FIG. 4, one implementation of a method 400 is shown for generating stacked glass package substrates from glass wafers with asymmetric metal layers. Glass wafers made of borosilicate, quartz material, fused silica, or other are selected for fabricating two glass package substrates. In an implementation, the fabrication process steps described earlier regarding FIGS. 1-2 are used. For example, the fabrication process fabricates a first glass package substrate with a redistribution layer on a single side of the glass wafer (block 402). The fabrication process fabricates a second glass package substrate with a redistribution layer on a single side of the glass wafer and no micro bumps (block 404).

The fabrication process flips the second glass package substrate upside down (block 406). Following, the fabrication process connects the glass wafers of the first and second glass package substrates together using a wafer bonding technique (block 408). In some implementations, the fabrication process uses copper-based wafer bonding. The heat generated by the wafer bonding technique sinks through the copper bonding medium between the two glass wafers. The resulting bonding between the two glass wafers contains no air gap, no underfill, and no solder bumps. Afterward, the side of the first glass package substrate opposite the glass wafer is connected to at least one integrated circuit (block 410). Additionally, the side of the second glass package substrate opposite the glass wafer is connected to the motherboard (block 412).

The two glass package substrates do not generate a signal on a node until one or more power connections receive a power supply voltage, the one or more ground reference connections receive a ground reference voltage, and the one or more input nodes receive a potential such as Boolean logic level. The Boolean logic level is one of a logic high level, such as the power supply voltage, or a logic low level such as the ground reference voltage. If a potential is not applied to a first node of the integrated circuit or a component on the motherboard ("no" branch of the conditional block 414), then the two glass package substrates wait for power up (block 416). However, if a potential is applied to the first node ("yes" branch of the conditional block 710), then at least one metal layer of each of the first glass package substrate and the second glass package substrate conveys a current between the integrated circuit and the component on the motherboard (block 418).

Figure 5:
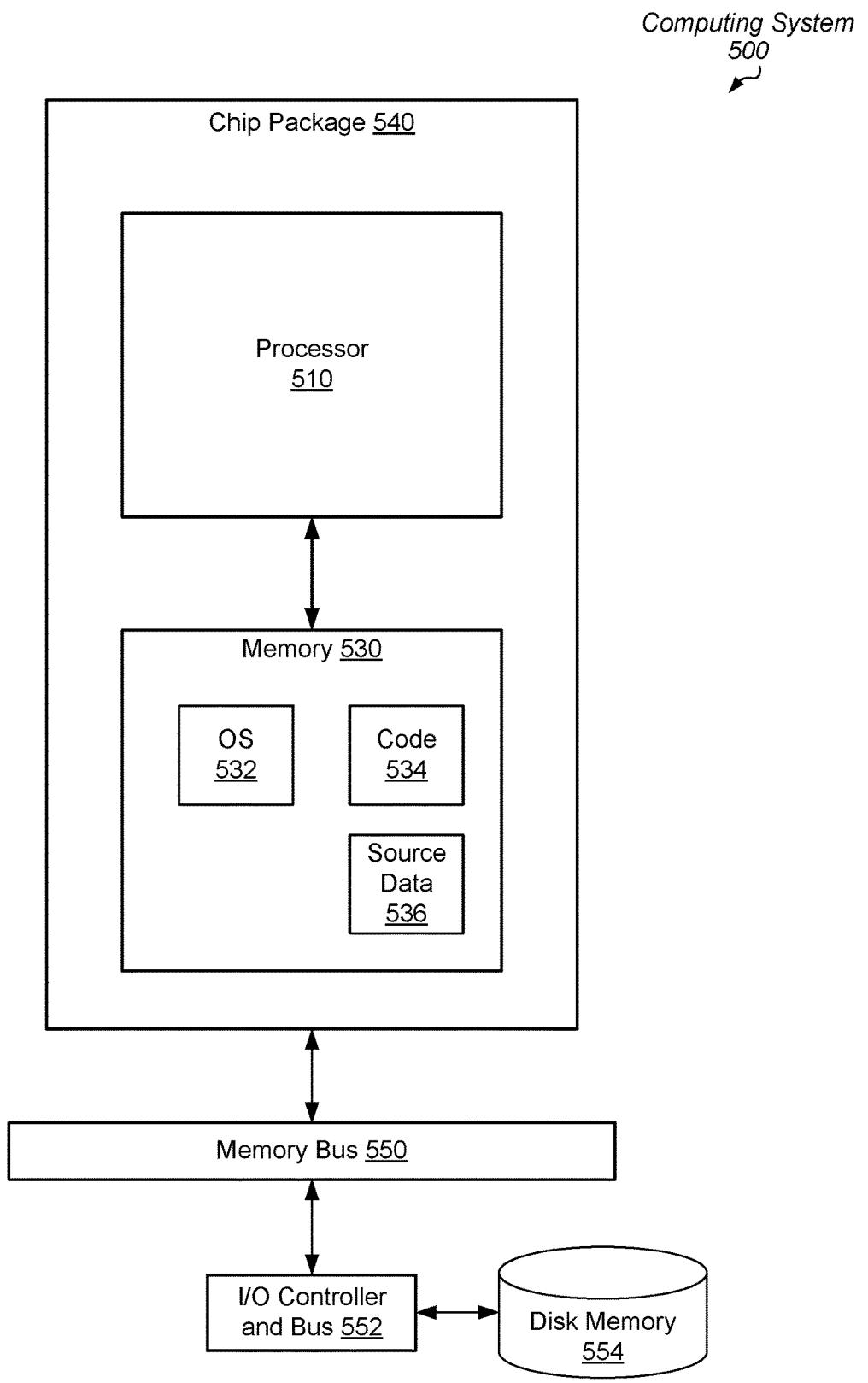
FIG. 5 is a generalized diagram of computing system that utilizes stacked glass package substrates with asymmetric metal layers.

Referring to FIG. 5, one implementation of a computing system 500 is shown that utilizes stacked glass package substrates from glass wafers with asymmetric metal layers. The computing system 500 utilizes a Chip Package 540, which includes the stacked glass package substrates from glass wafers with asymmetric metal layers. The Chip Package 540 uses one of a ball grid array (BGA) surface mount package, a chip scale package (CSP), and a System in Package (SiP) that communicates with other components on a motherboard (or printed circuit board). In an implementation, the computing system 500 includes the processor 510 and the memory 530 in the Chip Package 540. In another implementation, only one of the includes the processor 510 and the memory 530 in the Chip Package 540 is included in the Chip Package 540. Interfaces, such as a memory controller, a bus or a communication fabric, one or more phased locked loops (PLLs) and other clock generation circuitry, a power management unit, and so forth, are not shown for ease of illustration. Additionally, in the illustrated implementation, the Chip Package 540 is connected to the disk memory 554 through the memory bus 550 and the input/output (I/O) controller and bus 552.

It is understood that in other implementations, the computing system 500 includes one or more of other processors of a same type or a different type than processor 510, one or more peripheral devices, a network interface, one or more other memory devices, and so forth. In some implementations, the functionality of the computing system 500 is incorporated on a system on chip (SoC). In other implementations, the functionality of the computing system 500 is incorporated on a peripheral card inserted in a motherboard. The computing system 500 is used in any of a variety of computing devices such as a desktop computer, a tablet computer, a laptop, a smartphone, a smartwatch, a gaming console, a personal assistant device, and so forth.

The processor 510 includes hardware such as circuitry. In various implementations, the processor 510 includes one or more processing units. In some implementations, each of the processing units includes one or more processor cores capable of general-purpose data processing, and an associated cache memory subsystem. In such an implementation, the processor 510 is a central processing unit (CPU). In another implementation, the processing cores are compute units, each with a highly parallel data microarchitecture with multiple parallel execution lanes and an associated data storage buffer. In such an implementation, the processor 510 is a graphics processing unit (GPU), a digital signal processor (DSP), or other.

In some implementations, the memory 530 includes one of a variety of types of dynamic random access memories (DRAMs). In some implementations, the memory 530 utilizes three-dimensional (3-D) packaging and includes memory dies placed horizontally next to the processor 510 on the stacked glass package substrates with asymmetric metal layers. In another implementation, the memory 530 utilizes 3-D packaging and includes additional memory dies vertically stacked on top of the memory dies placed horizontally next to the processor 510 on the stacked glass package substrates. The memory 530 stores at least a portion of an operating system (OS) 532, one or more applications represented by code 534, and at least source data 536. In various implementations, the memory 530 stores a copy of these software components 532, 534 and 536 that have original copies stored on disk memory 554. Memory 530 is also capable of storing intermediate result data and final result data generated by the processor 510 when executing a particular application of code 534.

In various implementations, the off-chip disk memory 554 includes one or more hard disk drives (HDDs) and Solid-State Disks (SSDs) comprising banks of Flash memory. The I/O controller and bus 552 supports communication protocols with the off-chip disk memory 554. Although a single operating system 532 and a single instance of code 534 and source data 536 are shown, in other implementations, another number of these software components are stored in memory 530 and disk memory 554. The operating system 532 includes instructions for initiating the boot up of the processor 510, assigning tasks to hardware circuitry, managing resources of the computing system 500 and hosting one or more virtual environments.

Each of the processor 510 and the memory 530 includes an interface unit for communicating with one another as well as any other hardware components included in the computing system 500. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
a first glass package substrate comprising:
redistribution layers between a first integrated circuit and a first side of a first glass wafer; and
bump pads directly placed on:
pads of a motherboard; and
a second side different than the first side of the first glass wafer; and
wherein responsive to a potential being applied to a first node of one of the first integrated circuit and a first component on the motherboard, a current is conveyed from the first node to a second node through the first glass package substrate.

2. The apparatus as recited in claim 1, wherein each power connection between the first integrated circuit and the first component traverses a through glass via of the first glass package substrate in place of traversing back side metal layers.

3. The apparatus as recited in claim 1, wherein the first glass wafer of the first glass package substrate comprises one of borosilicate, quartz material, and fused silica.

4. The apparatus as recited in claim 1, wherein the redistribution layers comprise organic dielectric layers.

5. The apparatus as recited in claim 1, further comprising:
a second glass package substrate coupled to a second integrated circuit;
a third glass package substrate coupled to a second component on a motherboard; and
a hybrid bond layer between the second glass package substrate and the third glass package substrate; and
wherein responsive to a potential being applied to a third node of one of the second integrated circuit and the second component on the motherboard, a current is conveyed from the third node to a fourth node through each of the second glass package substrate and the third glass package substrate.

6. The apparatus as recited in claim 5, wherein the hybrid bond layer comprises copper with no solder bumps.

7. The apparatus as recited in claim 5, wherein each of second glass package substrate and the third glass package substrate has redistribution layers on a single side of a respective glass wafer.

8. A computing system comprising:
a memory on a printed circuit board, wherein the memory comprises circuitry configured to store instructions of one or more tasks; and a processing circuit in a chip package coupled to the memory through an apparatus, wherein the apparatus comprises:
a first integrated circuit coupled to a first glass package substrate comprising:
redistribution layers between the first integrated circuit and a first side of a first glass wafer; and
bump pads directly placed on:
pads of the printed circuit board; and
a second side different than the first side of the first glass wafer; and
wherein responsive to a potential being applied to a first node of one of the processing circuit and the memory, a current is conveyed from the first node to a second node through the first glass package substrate.

9. The computing system as recited in claim 8, wherein each power connection between the first integrated circuit and the memory traverses a through glass via of the first glass package substrate in place of traversing back side metal layers.

10. The computing system as recited in claim 8, wherein the redistribution layers comprise organic dielectric layers.

11. The computing system as recited in claim 8, wherein the apparatus further comprises:
a second glass package substrate coupled to a second integrated circuit;
a third glass package substrate coupled to the printed circuit board; and
a hybrid bond layer between the second glass package substrate and the third glass package substrate; and
wherein responsive to a potential being applied to a third node of one of the processing circuit and the memory, a current is conveyed from the third node to a fourth node through each of the second glass package substrate and the third glass package substrate.

12. The computing system as recited in claim 11, wherein the hybrid bond layer comprises copper with no solder bumps.

13. The computing system as recited in claim 11, wherein each of second glass package substrate and the third glass package substrate has redistribution layers on a single side of a respective glass wafer.

* * * * *